(12) United States Patent
Higashi et al.

(10) Patent No.: US 6,404,070 B1
(45) Date of Patent: Jun. 11, 2002

(54) SEMICONDUCTOR DEVICE

(75) Inventors: Mitsutoshi Higashi; Kei Murayama; Hideaki Sakaguchi; Hiroko Koike, all of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/627,976

(22) Filed: Jul. 28, 2000

(30) Foreign Application Priority Data

Aug. 3, 1999 (JP) .......................................... 11-220113

(51) Int. Cl.$^7$ ............................................. H01L 23/28
(52) U.S. Cl. ........................................ 257/796; 257/778
(58) Field of Search ................................ 428/116, 229, 428/167; 65/99.2; 427/450; 442/179; 257/778, 796, 785, 720, 706

(56) References Cited

U.S. PATENT DOCUMENTS

| | | | |
|---|---|---|---|
| 5,021,283 A | * 6/1991 | Takenaka et al. | ............ 428/116 |
| 5,059,232 A | * 10/1991 | Kurashina et al. | ............ 65/99.2 |
| 5,224,030 A | 6/1993 | Banks et al. | |
| 5,455,107 A | * 10/1995 | Homma et al. | ............. 428/229 |
| H1699 H | 12/1997 | Vavrick | |
| 5,766,691 A | * 6/1998 | Arnold et al. | ............... 427/450 |
| 5,858,511 A | * 1/1999 | Lisowsky | ................... 428/167 |
| 6,110,847 A | * 8/2000 | Yamamoto et al. | ......... 442/179 |

FOREIGN PATENT DOCUMENTS

| | | |
|---|---|---|
| EP | 0-257-466 | 8/1987 |
| EP | 0-740-340 A2 | 10/1996 |
| JP | 8-37204 | 7/1994 |
| JP | 11-260963 | 3/1998 |

OTHER PUBLICATIONS

Search report issued out of The Hague on application No. EP–00–30–6362.

* cited by examiner

*Primary Examiner*—David Nelms
*Assistant Examiner*—Bau T Le
(74) *Attorney, Agent, or Firm*—Paul & Paul

(57) ABSTRACT

A semiconductor device having a heat dissipation plate which is lighter in weight and smaller in thickness than the conventional metal plate while ensuring a good thermal dissipation and mechanical support, which comprises: a semiconductor chip having a back surface bonded to a lower surface of a heat dissipation plate having an area larger than that of the semiconductor chip; a wiring board composed of a substrate having an upper surface with conductor patterns formed thereon, the conductor patterns having first ends connected to external connection terminals downwardly penetrating through the substrate via through holes extending through the substrate, the external connection terminals being disposed between a periphery of the semiconductor chip and a periphery of the wiring substrate; the semiconductor chip and the wiring board being bonded to each other so that electrode terminals formed on an active surface of the semiconductor chip are electrically connected to second ends of the conductor patterns; and the heat dissipation plate being composed of a fabric of carbon fibers and a resin impregnated in the fabric.

17 Claims, 3 Drawing Sheets

SEMICONDUCTOR DEVICE

BACKGROUND OF THE INVENTION

1. Field of the Invention

The present invention relates to a semiconductor device including a semiconductor chip having a back surface bonded to a heat dissipation plate.

2. Description of the Related Art

FIG. 9 shows a conventional BGA (ball grid array) semiconductor device including a metal plate 100 of a copper, aluminum, or other highly heat-conductive metal and a semiconductor chip 102 having a back surface bonded to a lower surface of the metal plate 100 with an adhesive layer 103. Electrode terminals 104 are formed on an active surface, opposite to the back surface, of the semiconductor chip 102 and are flip-chip bonded to first ends of conductor patterns 108 formed on an upper surface of a flexible circuit substrate 106.

The flexible circuit substrate 106 is composed a flexible resin film 110 of polyimide or other electrically insulating resin, conductor patterns 108 are formed on one surface of the substrate 106, external connection terminals or solder balls 112 are formed on second ends of the conductor patterns 108 and downwardly extend through the resin film 110 via through holes 111 via through holes 111 of the resin film 110 to protrude from a lower surface of the resin film 110. The flexible circuit substrate 106, the metal plate 100 and the semiconductor chip 102 are bonded together with an adhesive layer 114.

The metal plate 100 has an area larger than that of the semiconductor chip 102. The external connection terminals or solder balls 112 are located between a periphery of the semiconductor chip 102 and a periphery of the metal plate 100. The conductor patterns 108 are bonded to the metal plate 100 with the adhesive layer 114 and provide electrical connection from the electrode terminals 104 to the solder balls 112. The metal plate 100 provides thermal dissipation and a direct support for the flexible circuit substrate 106, and in turn, an indirect support for the solder balls 112 and the conductor patterns 108.

The BGA semiconductor device shown in FIG. 9 provides a reduction in cost and fine conductor patterns in comparison with prior BGA types.

However, problems arise with the recent trend of a reduction in the thickness of the semiconductor chip 102 to as small as 100 μm or less.

The external connection terminals or solder balls 112 are supported by the flexible circuit substrate 106 while being located between a periphery of the semiconductor chip 102 and a periphery of the metal plate 100, and therefore, the metal plate must serve as a mechanical support as well as a thermal dissipator.

As the thickness of the metal plate 100 is reduced, the mechanical support provided by the metal plate 100 is lowered. Therefore, the metal plate has a lower limit, in thickness, of about 200 to 500 μm, which is larger than the thickness of the semiconductor chip 102.

The semiconductor chip 102 also has a lower limit in thickness, so that there is a limit when reducing the thickness of semiconductor device by reducing the thickness of the semiconductor chip 102.

To achieve a further reduction in the weight and thickness of semiconductor devices, it is therefore desirable that an alternative member replaces the conventional metal plate to provide a good thermal dissipation and mechanical support while being lighter in weight and smaller in thickness than the metal plate.

SUMMARY OF THE INVENTION

The object of the present invention is to provide a semiconductor device having a heat dissipation plate which is lighter in weight and smaller in thickness than the conventional metal plate while ensuring a good thermal dissipation and mechanical support.

To achieve the object according to the present invention, there is provided a semiconductor device comprising:

a semiconductor chip having a back surface bonded to a lower surface of a heat dissipation plate having an area larger than that of the semiconductor chip;

a wiring board composed of a substrate having an upper surface with conductor patterns formed thereon, the conductor patterns having first ends connected to external connection terminals downwardly penetrating through, and protruding from a lower surface of, the substrate via through holes extending therethrough, the external connection terminals being disposed between a periphery of the semiconductor chip and a periphery of the wiring substrate;

the semiconductor chip and the wiring board being bonded to each other so that electrode terminals formed on an active surface of the semiconductor chip are electrically connected to second ends of the conductor patterns; and the heat dissipation plate being composed of a fabric of carbon fibers and a resin impregnated in the fabric.

According to the present invention, the heat dissipation plate composed of a fabric of carbon fibers and a resin impregnated therein is lighter in weight than the conventional metal plate and provides good thermal dissipation and good mechanical support even when it has a reduced thickness. The carbon fibers of the heat dissipation plate have carbon chains oriented in the length direction thereof to provide a heat conduction coefficient as high as, or greater than, that of a metal of the conventional metal plate. The carbon fibers reinforce the heat dissipation plate to provide good mechanical strength even when the plate has a thickness as small as 100 μm or less.

Thus, the heat dissipation plate of the present invention is lighter in weight than the conventional metal plate and provides a heat conduction comparable with, or greater than, that of the conventional metal plate, so that the semiconductor device of the present invention is lighter in weight and smaller in thickness than the conventional semiconductor device.

In a preferred embodiment, to provide a further reduction in weight and thickness, the wiring board comprises a flexible resin film and the second ends of the conductor patterns and the electrode terminals of the semiconductor chip are flip-chip bonded to each other.

In another preferred embodiment, to enable the amount of the impregnated resin to be as small as possible, the carbon fibers are carbon filaments and/or the fabric is a woven fabric of filamentary yarns each composed of a bundle of plural carbon filaments folded together.

In another preferred embodiment, the heat dissipation plate has sides containing cut ends of the carbon fibers and the cut ends are covered with a resin to prevent carbon particles from being generated from the cut surfaces.

In another preferred embodiment, the heat dissipation plate is composed of one piece of a woven fabric of carbon fibers and a resin impregnated in the woven fabric to provide a reduced thickness while ensuring an improved strength.

In another preferred embodiment, the heat dissipation plate is composed of a laminate of plural pieces of a woven fabric of carbon fibers and a resin impregnated in the fabric, the laminate having sides defined by cut surfaces formed by cutting in a direction of the lamination thereof and the cut surfaces being covered with a resin, to provide continuous carbon fibers, as a heat conduction path, through the thickness of the heat dissipation plate, thereby promoting heat dissipation.

DESCRIPTION OF THE PREFERRED EMBODIMENTS

Figure 1:
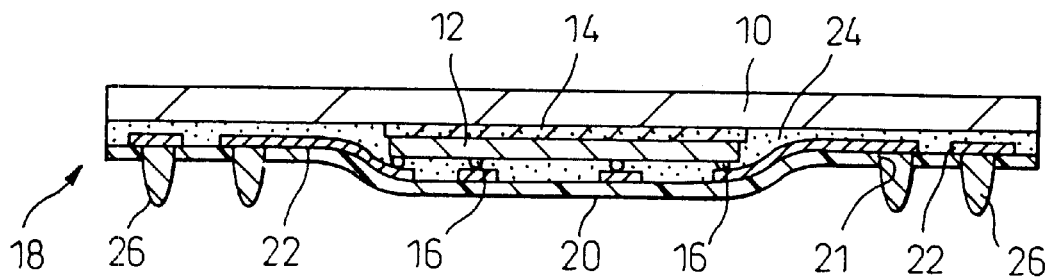
FIG. 1 is a cross-sectional view of a semiconductor device according to the present invention.

FIG. 1 shows a preferred embodiment of the semiconductor device according to the present invention, which includes a semiconductor chip 12 having a back surface bonded to a lower surface of a heat dissipation plate 10 via an adhesive layer 14. The semiconductor chip 12 also has, opposite to the back surface, an active surface having electrode terminals 16 formed thereon and electrically connected to conductor patterns 22 formed on a flexible circuit board 18.

The flexible circuit board 18 includes a flexible resin film 20 of polyimide or other electrically insulating resin film 20 having an upper surface with conductor patterns 22 formed thereon, the conductor patterns 22 having first ends connected to external terminals or solder balls 26 downwardly penetrating through, and protruding from a lower surface of, the resin film 20 via through holes 21 extending through the resin film 20.

The electrode terminals 16 are disposed on the active surface of the semiconductor chip 12 either in arrays or along a periphery of the semiconductor chip 12 and are flip-chip bonded to second ends of the conductor patterns 22 on the flexible circuit board 18. The flexible circuit board 18, the heat dissipation plate 10 and the semiconductor chip 12 are bonded together with an adhesive layer 24 of a polyimide, epoxy or silicone adhesive.

The external connection terminals or solder balls 26 are formed by screen-printing a solder paste of an Sn-Al, Sn-Ag or Sn-Pb solder in selected positions and thickness at through holes 21 having one end defined by the first ends of the conductor patterns 22 in a region of the resin film 20 between the periphery of the semiconductor chip 12 and a periphery of the heat dissipation plate 10, followed by reflowing the printed solder paste.

The flexible circuit board 18 having the solder balls 26 and the conductor patterns 22 formed thereon is mechanically supported by the heat dissipation plate 10 bonded thereto with the adhesive layer 24 and having an area greater than that of the semiconductor chip 12. Thus, the heat dissipation plate 10 also acts as a mechanical support for the flexible circuit board 18 and, in turn, for the solder balls 26 and the conductor patterns 22.

Figure 2:
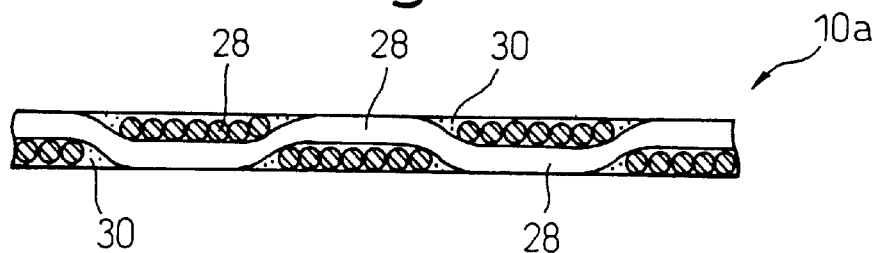
FIG. 2 is a cross-sectional view of a heat dissipation plate according to the present invention.
Figure 3:
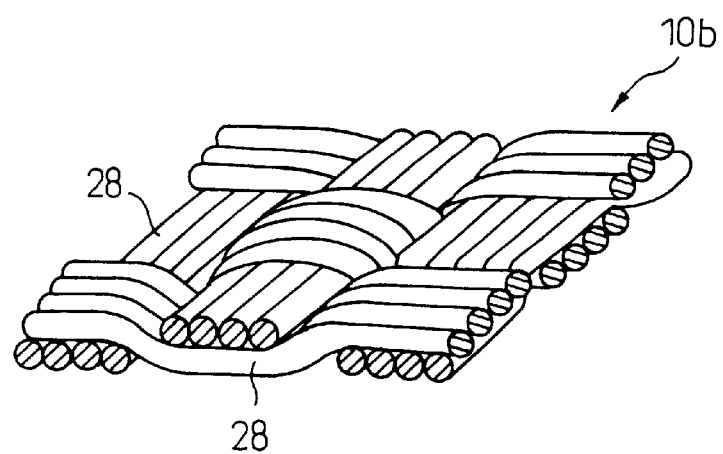
FIG. 3 is cross-sectional view of a woven fabric advantageously applicable as a reinforcing and heat conducting component of a heat dissipation plate according to the present invention.

The heat dissipation plate 10 is composed of a fabric of carbon fibers and a resin impregnated in the fabric. FIG. 2 shows a partial cross-section of a plate member 10a applicable as the heat dissipation plate 10. The fabric is woven from filamentary yarns 28 of plural carbon fibers in the form of filaments, as shown in FIG. 3.

To produce the heat dissipation plate 10, a woven fabric 10b of filamentary yarns 28 is impregnated with a resin 30 to form an integrated solid. The resin 30 is preferably epoxy or another thermosetting resin and is impregnated in as small an amount as possible to fix intersections of warp yarns and filling yarns. Resins are usually lower in heat conduction than metals or carbon fibers and the heat conduction coefficient of the plate member 10a is lowered as the impregnated resin amount is increased.

The filamentary yarn 28 is formed by cohesion of plural filaments or carbon fibers having a diameter of 10 $\mu$m and it is not necessary to fix all of the filaments of the yarn 28 with the resin 30. The cohesion of the filaments is achieved by twisting a bundle of plural filaments at several tens to hundreds of turns per meter.

The plate member 10a has cut surfaces of filamentary yarns 28, i.e., cut surfaces of the filaments of the yarn 28, which are preferably covered with the resin 30. If the cut surfaces of the filamentary yarns 28 are exposed, carbon powder particles may be generated at the exposed surfaces of the component carbon filaments.

A carbon fiber in the form of a carbon filament has carbon chains oriented in the length direction thereof, so that no carbon particles are generated or exfoliated from the side surface of the filament. Therefore, the impregnated resin amount can be as small as possible even if the side surfaces of the filaments are exposed from the resin 30 providing the cut surfaces of the filaments are covered with the resin 30.

The filamentary yarn 28 may consist of a PAN (polyacrylonitrile) carbon fiber or a pitch carbon fiber produced from a petroleum distillation residue.

The fabric 10b may be replaced by a nonwoven fabric of carbon staple fibers. A nonwoven fabric is formed by bonding carbon staple fibers together with a resin, in which the resin amount tends to be greater than that necessary when using the woven fabric 10 of filamentary yarns.

The cross-sectional shape of the carbon fibers is not limited and may be circular, triangular, oval, etc. The carbon fibers may be either solid or hollow.

The carbon fibers may be monofilaments greater in diameter than those of the filamentary yarns 28. A fabric woven of monofilaments is preferably composed of monofilaments in close contact with each other.

The weave of the woven fabric 10b is not limited but may be plain, twill, satin, or another desired weave.

The woven fabric 10b shown in FIG. 3 is prepared by cutting a wider woven fabric. The woven fabric 10b in the as-cut condition has intersecting or neighboring filaments not fixed together and does not have a strength necessary for the heat dissipation plate 10. Moreover, the cut surfaces of the filamentary yarns 28, or filaments of the yarns 28, are exposed to allow generation of carbon particles from the cut surfaces.

It is therefore necessary to immerse the woven fabric 10b in a solution of epoxy or other thermosetting resins to cause the woven fabric 10 to be impregnated with the resin 30 so that intersecting and neighboring filaments are fixed together and the cut surfaces of the filaments are also covered with the resin 30. The impregnated resin amount can be controlled by the duration for which the woven fabric 10b is immersed in the resin solution.

The woven fabric 10b is then heated at a selected temperature to cure the resin 30 impregnated in the fabric 10b and covering the cut surfaces of the filamentary yarns 28, to provide the plate member 10a shown in FIG. 2.

In an alternative embodiment, the wider woven fabric may be immersed in the solution of a thermosetting resin followed by curing of the resin, in which an additional step is necessary to cover the cut surfaces of the filamentary yarns 28 with a resin.

Figure 4:
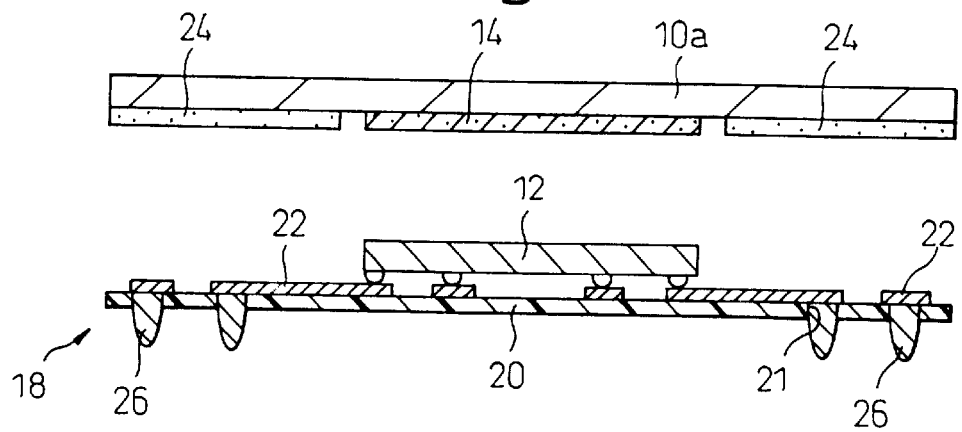
FIG. 4 is a cross-sectional view showing a process of assembling a semiconductor device according to the present invention.
Figure 5:
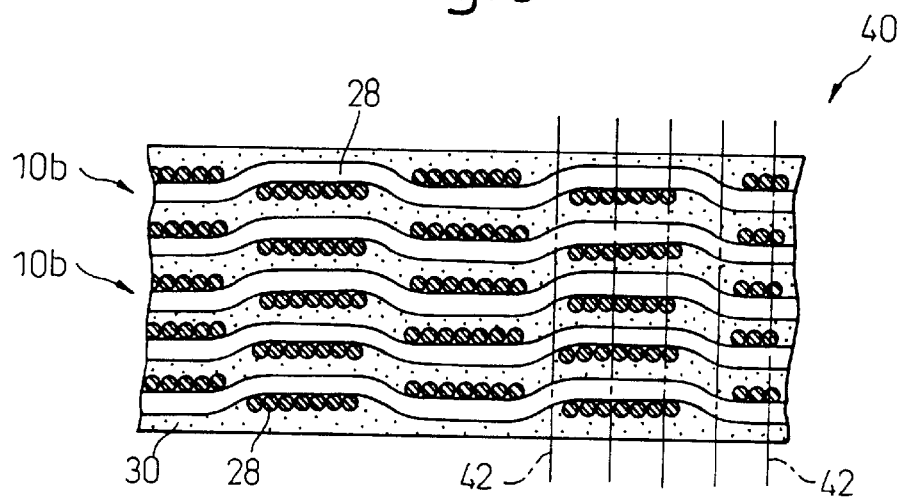
FIG. 5 is a cross-sectional view of a laminate of plural woven fabrics with a resin impregnated therein according to the present invention.

FIG. 4 shows a process of producing a semiconductor device using the above-prepared plate member 10a.

A flexible circuit board 18 includes a resin film 20 having a lower surface on which solder balls 26 are formed by screen-printing a solder paste of a Sn—Al, Sn—Ag or Sn—Pb solder at selected positions and reflowing the printed solder paste and an upper surface on which conductor patterns 22 are formed, the conductor patterns 22 having first ends connected to upper ends of the solder balls 26.

A semiconductor chip 12 is first mounted on the flexible circuit board 18 by flip-chip bonding electrode terminals 16 of the chip 12 to second ends of the conductor patterns 22.

Adhesive layers 14 and 24 are then formed on the plate member 10a by screen printing or other methods to allow bonding of the plate member 10a to the semiconductor chip 12 and to the flexible circuit board 18, respectively. The adhesive layer 24 may consist of an adhesive usually used in semiconductor devices and preferably consists of an adhesive composed of a thermosetting resin.

In the next step, the flexible circuit board 18 with the semiconductor chip 12 mounted thereon and the plate member 10a with the adhesive layers 14 and 24 are press-bonded together.

The resin film 20 has through holes 21 filled with the solder balls 26 having upper ends connected to the first ends of the conductor patterns 22. The through holes 21 are disposed outside the region of the circuit board 18 where the semiconductor chip 12 is mounted, i.e., disposed in a region between the periphery of the chip 12 and the periphery of the board 18, so that the solder balls 26 are also disposed in the region between the periphery of the chip 12 and the periphery of the board 18.

Referring to FIG. 1, the thus-produced semiconductor device has a heat dissipation plate 10, composed of the plate member 10a, which provides heat dissipation from the semiconductor chip 12 and mechanical support for the flexible circuit board 18 at the same time. The heat dissipation plate 10 contains the woven fabric 10b composed of carbon fibers having a heat conduction coefficient comparable with or greater than that of a metal, so that heat generated by the semiconductor chip 12 is readily transferred through the carbon fibers of the heat dissipation plate 10.

The heat dissipation plate 10 preferably has a thickness of about 50 $\mu$m to 100 $\mu$m, typically about 80 $\mu$m. The flexible circuit board 18 preferably has a thickness of about 40 $\mu$m to 50 $\mu$m and the external connection terminals or solder balls 26 connected to the conductor patterns 22 of the flexible circuit board 18 have a height of about 150 $\mu$m to 200 $\mu$m. The semiconductor chip 12 is mounted on the flexible circuit board 18 by flip chip bonding so that the semiconductor chip 12 is disposed within a region having upper and lower ends defined by the height of the external connection terminals 26. Thus, the semiconductor device shown in FIG. 1 has an extremely reduced thickness of about 300 $\mu$m to 400 $\mu$m.

The carbon fiber is also lighter in weight and greater in stiffness than the glass fiber conventionally used in the substrate or board of semiconductor devices, so that the heat dissipation plate 10 has good mechanical strength even when it has a reduced thickness of 100 $\mu$m or less, which could not be achieved by the conventional heat dissipation plate of a metal such as copper.

According to the present invention, the semiconductor device can be reduced in thickness because the carbon fiber-reinforced heat dissipation plate 10 ensures good heat dissipation and mechanical support even when having a reduced thickness.

In an alternative embodiment, the adhesive layers 14 and 24 can be omitted if the resin 30 impregnated in the plate member 10a has an adhesive property.

Figure 6:
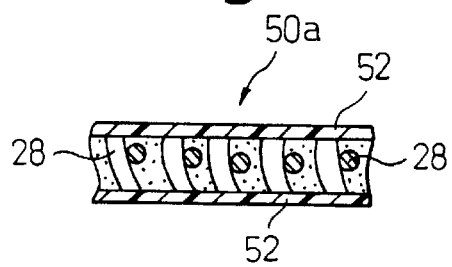
FIG. 6 is a cross-sectional view of a heat dissipation plate cut from the laminate shown in FIG. 5, according to the present invention.

In a further preferred embodiment, the plate member 10a shown in FIG. 2 formed from one piece of the woven fabric 10b, as shown in FIG. 3, can be replaced by a plate member 50a shown in FIG. 6, which is formed from a laminate of plural pieces of the woven fabric 10b with a resin 30 impregnated in the laminate forming a resin-impregnated laminate 40. The plate member 50a is produced by cutting the resin-impregnated laminate 40 in the thickness direction of the woven fabrics 10b as indicated by dotted lines 42.

The resin-impregnated laminate 40 has cut surfaces including cut surfaces of the filamentary yarns 28 of the woven fabric 10b and resin layers 52 are formed on the cut surfaces of the resin-impregnated laminate 40 to cover the cut surfaces of the filamentary yarns 28, thereby preventing generation of carbon powder therefrom, which would otherwise occur if the resin layers 52 were not provided. The resin layers 52 are composed of a resin, which may be the same resin as that impregnated in the laminated 40.

The plate member 50a contains the filamentary yarns 28 continuous through the thickness of the plate member 50a to provide a continuous heat path facilitating heat transfer from one side of the plate member 50a to the other, thereby achieving a further improved heat dissipation from the semiconductor chip 12.

The plate member 50a is also contains the filamentary yarns 20 extending in parallel with the plate surface to reinforce the plate member 50a, thereby providing the heat dissipation plate 50 with good strength even when having a reduced thickness.

Figure 7:
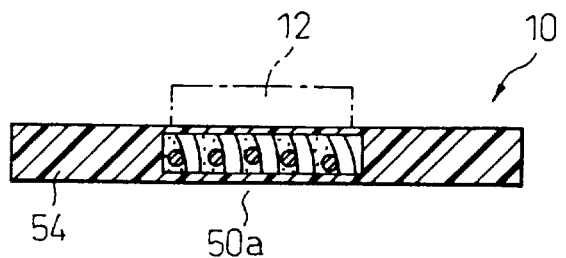
FIG. 7 is a cross-sectional view of another heat dissipation plate according to the present invention.

In a modified embodiment shown in FIG. 7, a heat dissipation plate 10 includes the plate member 50a shown in FIG. 6 in a position in which the semiconductor chip 12 is located. In portions other than that composed of the plate member 50a, the heat dissipation plate 10 is made of a resin. The heat dissipation plate 10 may be produced, for example, by an insert forming process using the plate member 50a as an insert.

In the semiconductor devices shown in FIGS. 1 to 7, the heat dissipation plate and the flexible circuit board 18 are directly bonded to each other with the adhesive layer 24.

Figure 8:
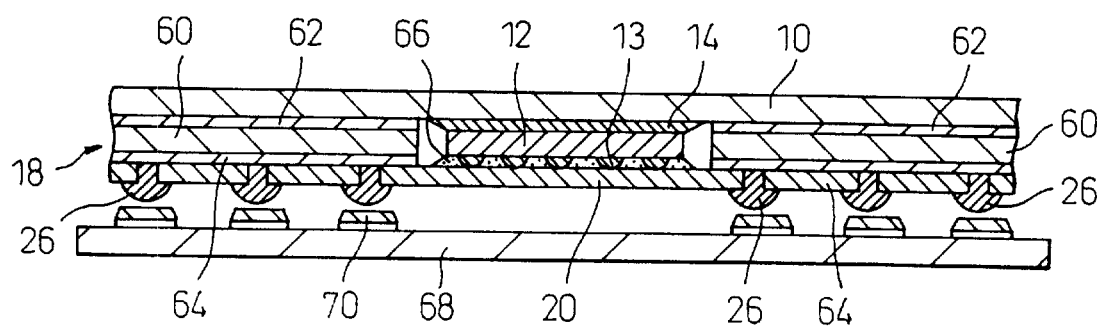
FIG. 8 is a cross-sectional view of another semiconductor device according to the present invention.
Figure 9:
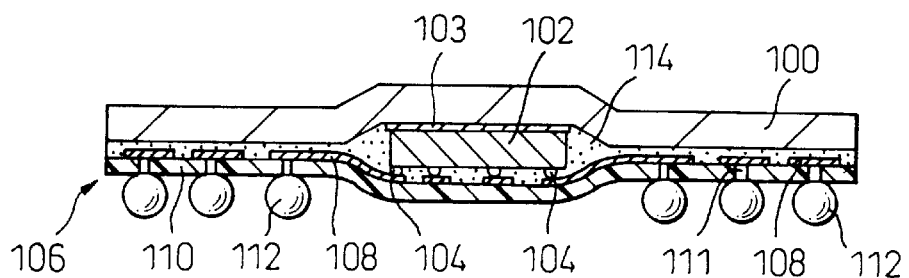
FIG. 9 is a cross-sectional view of a conventional semiconductor device.

FIG. 8 shows another embodiment in which a heat dissipation plate 10 and a flexible circuit board 18 are indirectly bonded to each other with a frame 60 intervening therebetween and having opposite sides bonded to the plate 10 and the board 18 with adhesive layers 62 and 64, respectively.

The frame 60 is composed of a resin film, a metal foil, etc., has a rectangular form surrounding the semiconductor chip 12 and forms an integrated solid by being bonded to the heat dissipation plate 10 and the flexible circuit board 18 to provide both a mechanical support for preventing distortion and other deformation of the semiconductor device and a further improved heat dissipation from the semiconductor device.

The semiconductor device shown in FIG. 8 is called a TBGA (Tape BGA), in which a semiconductor chip 12 has a back surface bonded with an adhesive to a heat dissipation plate 10 composed of the plate member 10a shown in FIG. 2 consisting of a fabric of carbon fibers and a resin impregnated therein. The semiconductor chip 12 has an active surface including electrode terminals 13 formed thereon and facing a flexible circuit board 18 having conductor patterns 22 flip-chip bonded to the electrode terminals 13 of the chip 12. The active surface of the chip 12 including the flip chip bonds is sealed with an underfill 66.

External connection terminals or solder balls 26 electrically connected to the conductor patterns 22 of the flexible circuit board 18 are bonded to conductor patterns 70 of a motherboard 68.

As herein described, the present invention provides a semiconductor device which is lighter in weight and smaller in thickness than the conventional metal plate while ensuring a good thermal dissipation and mechanical support.

The semiconductor device of the present invention is advantageously applied to cell phones or other electronic devices in which a reduction in weight and thickness is desired.

What is claimed is:

1. A semiconductor device comprising:

a semiconductor chip having a back surface bonded to a lower surface of a heat dissipation plate having an area larger than that of the semiconductor chip;

a wiring board composed of a substrate having an upper surface with conductor patterns formed thereon, the conductor patterns having first ends connected to external connection terminals downwardly penetrating through the substrate via through holes extending through the substrate, the external connection terminals being disposed between a periphery of the semiconductor chip and a periphery of the wiring substrate;

the semiconductor chip and the wiring board being bonded to each other so that electrode terminals formed on an active surface of the semiconductor chip are electrically connected to second ends of the conductor patterns; and the heat dissipation plate being composed of a fabric of carbon fibers and a resin impregnated in the fabric, wherein said plate is a laminate of plural pieces of said fabric of carbon fibers and resin impregnated in the fabric, said laminate having sides defined by cut surfaces having carbon fiber ends terminating there at, said sides carrying said carbon fiber ends being bonded to said semiconductor chip back surface.

2. A semiconductor device according to claim 1, wherein the wiring board comprises a flexible resin film and the second ends of the conductor patterns and the electrode terminals of the semiconductor chip are flip-chip bonded to each other.

3. A semiconductor device according to claim 1, wherein the carbon fibers are carbon filaments.

4. A semiconductor device according to claim 1, wherein the fabric is woven fabric of filamentary yarns each composed of a bundle of plural carbon filaments which is twisted from about several tens of turns per meter to about hundreds of turns per meter.

5. A semiconductor device according to claim 1, wherein the heat dissipation plate has sides containing cut ends of the carbon fibers, the cut ends being covered with a resin.

6. A semiconductor device according to claim 1, wherein the heat dissipation plate is composed of one piece of a woven fabric of carbon fibers and a resin impregnated in the woven fabric.

7. A semiconductor device according to claim 1, wherein the heat dissipation plate laminate has sides defined by cut surfaces formed by cutting in a direction of the lamination thereof and the cut surfaces being covered with a resin, wherein the surfaces of said plate laminate are defined by the cuts through the lamination with a width dimension of the laminate being defined by the thickness of the laminate at cutting.

8. A semiconductor device, having a thickness of about from 300 micrometers (300 $\mu$m) to 400 micrometers (400 $\mu$m), comprising:

a semiconductor chip having a back surface and an opposite surface from which electrode terminals extend;

a circuit board having a first surface with conductor patterns formed thereon, and connector means extending from respective portions of said conductor patterns to beyond a second opposite surface of said circuit board, said semiconductor chip electrode terminals being in contact with said circuit board conductor patterns;

a heat dissipation plate being composed of a fabric of carbon fibers with resin impregnation having a thickness of about from 50 $\mu$m to 100 $\mu$m and being in contact on a first surface thereof with said semiconductor chip back surface;

an epoxy layer bonding said first surface of said fabric carbon fiber heat dissipation plate to said circuit board first surface carrying said conductor patterns and surrounding said semiconductor chip;

wherein said semiconductor chip, electrodes, conductor pattern, flexible resin film and adhesive layer have a thickness of about 250 $\mu$m to 300 $\mu$m; and wherein said heat dissipation plate has its end cuts being resin coated to retard carbon particle exfoliation.

9. The semiconductor device of claim 8, wherein said fabric carbon fiber heat dissipation plate extends over the area of said circuit board, and wherein said epoxy layer surrounds said semiconductor chip and extends between said fabric carbon fiber heat dissipation plate and said circuit board thereby bonding each together.

10. The semiconductor device of claim 8 wherein said fabric carbon fiber heat dissipation plate has a fabric carbon fiber heat dissipation section which extends only over said semiconductor chip and wherein the remaining portion of said heat dissipation plate is made of resin.

11. The semiconductor device of claim 9, wherein said circuit board includes a flexible resin film carrying holes therethrough, wherein said conductor patterns are formed a first surface thereof, and wherein said extending connector means connect to said conductor patterns and extend respectively, one though one of said flexible resin film holes to a second opposite surface of said flexible resin film, and wherein said semiconductor electrode terminals are connected to said conductor patterns in flip-chip fashion.

12. The semiconductor device of claim 11, wherein said heat dissipation plate fabric is a singe piece of woven fabric of carbon fibers and a resin impregnated in said woven fabric, and wherein said woven fabric is of filamentary yams each composed of a bundle of plural carbon filaments being twisted at from about several tens of turns per meter to about hundreds of turns per meter.

13. A semiconductor device, comprising:
- a semiconductor chip having a back surface and an opposite surface from which electrode terminals extend;
- a circuit board including a flexible film having a first surface carrying conductor patterns thereon, and connector means extending from respective portions of said conductor patterns through holds in said flexible film to beyond a second opposite surface of said flexible film, said semiconductor chip electrode terminals being in contact with said circuit board conductor patterns; and
- a heat dissipation plate being composed of a fabric of carbon fibers with resin impregnation, said resin having adhesive properties, wherein said resin impregnated carbon fiber fabric is adhered to said conductor patterned first side of said flexible film and adhered to said back surface of said semiconductor chip, thereby encapsulating said semiconductor chip onto said conductor patterned first side of said flexible film.

wherein said resin impregnated carbon fiber fabric has its cut ends resin coated to retard carbon particle exfoliation.

14. The semiconductor device of claim 13, wherein said heat dissipation plate is as large as said semiconductor chip and covers the entirety of the back surface thereof; and wherein said epoxy layer is a resin layer.

15. The semiconductor device of claim 14 wherein said resin impregnated carbon fiber fabric heat dissipation plate is about from about 50 micrometers to about 100 micrometers.

16. The semiconductor device of claim 15 wherein said semiconductor chip is flip-chip connected to said flexible film conductor pattern.

17. The semiconductor device of claim 16 wherein said resin impregnated carbon fiber fabric heat dissipation plate provides mechanical support to said flexible film.

* * * * *